(12) United States Patent
Filippi et al.

(10) Patent No.: US 9,536,779 B2
(45) Date of Patent: Jan. 3, 2017

(54) SELECTIVE LOCAL METAL CAP LAYER FORMATION FOR IMPROVED ELECTROMIGRATION BEHAVIOR

(71) Applicant: International Business Machines Corporation, Armonk, NY (US)

(72) Inventors: Ronald G. Filippi, Wappingers Falls, NY (US); Erdem Kaltalioglu, Newburgh, NY (US); Ping-Chuan Wang, Hopewell Junction, NY (US); Lijuan Zhang, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/721,440

(22) Filed: May 26, 2015

(65) Prior Publication Data

US 2015/0255328 A1 Sep. 10, 2015

Related U.S. Application Data

(60) Division of application No. 13/964,772, filed on Aug. 12, 2013, now Pat. No. 9,123,726, which is a
(Continued)

(51) Int. Cl.
*H01L 23/48* (2006.01)
*H01L 21/4763* (2006.01)
(Continued)

(52) U.S. Cl.
CPC ..... *H01L 21/76816* (2013.01); *H01L 21/7685* (2013.01); *H01L 21/76832* (2013.01);
(Continued)

(58) Field of Classification Search
CPC ............. H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541; H01L 21/7685
(Continued)

(56) References Cited

U.S. PATENT DOCUMENTS 4,962,060 A 10/1990 Sliwa et al.
5,410,490 A 4/1995 Yastrow
(Continued)

OTHER PUBLICATIONS

Douglas J. Guerrero, et al.,"Anti-reflective coating for multipatterning lithography," Advances in Resist Materials and Processing Technology XXV, edited by Clifford L. Henderson, Proc. of SPIE, vol. 6923, 69230X, 2008, pp. 1-7.
(Continued)

*Primary Examiner* — Julio J Maldonado
*Assistant Examiner* — Moin Rahman
(74) *Attorney, Agent, or Firm* — Cantor Colburn LLP; Steven Meyers

(57) ABSTRACT

A method of forming a wiring structure for an integrated circuit device includes forming a first metal line within an interlevel dielectric (ILD) layer, and forming a second metal line in the ILD layer adjacent the first metal line; masking selected regions of the first and second metal lines; selectively plating metal cap regions over exposed regions of the first and second metal lines at periodic intervals such that a spacing between adjacent metal cap regions of an individual metal line corresponds to a critical length, L, at which a back stress gradient balances an electromigration force in the individual metal line, so as to suppress mass transport of electrons; and wherein the metal cap regions of the first metal line are formed at staggered locations with respect to the metal cap regions of the second metal line, along a common longitudinal axis.

6 Claims, 14 Drawing Sheets

Related U.S. Application Data continuation-in-part of application No. 13/744,705, filed on Jan. 18, 2013, now Pat. No. 9,076,847.

(51) Int. Cl.
  *H01L 21/768* (2006.01)
  *H01L 23/532* (2006.01)
  *H01L 23/522* (2006.01)
  *H01L 23/528* (2006.01)

(52) U.S. Cl.
  CPC .. *H01L 21/76834* (2013.01); *H01L 21/76849* (2013.01); *H01L 21/76885* (2013.01); *H01L 23/528* (2013.01); *H01L 23/5222* (2013.01); *H01L 23/53238* (2013.01); *H01L 23/53295* (2013.01); *H01L 2924/0002* (2013.01)

(58) Field of Classification Search
  USPC ........ 257/751, 760, 637; 438/627, 687, 643, 438/795, 624, 678
  See application file for complete search history.

(56) References Cited

U.S. PATENT DOCUMENTS

| | | | |
|---|---|---|---|
| 5,439,731 A | 8/1995 | Li et al. | |
| 5,470,788 A | 11/1995 | Biery et al. | |
| 5,737,580 A | 4/1998 | Hathaway et al. | |
| 5,899,707 A | 5/1999 | Sanchez et al. | |
| 6,245,996 B1 | 6/2001 | Atakov et al. | |
| 6,251,528 B1 | 6/2001 | Uzoh et al. | |
| 6,410,209 B1 | 6/2002 | Adams et al. | |
| 6,413,854 B1* | 7/2002 | Uzoh et al. | 438/637 |
| 6,489,684 B1 | 12/2002 | Chen et al. | |
| 6,597,067 B1 | 7/2003 | Biery et al. | |
| 6,677,647 B1 | 1/2004 | Dawson | |
| 6,678,951 B2 | 1/2004 | Atakov et al. | |
| 7,016,794 B2 | 3/2006 | Schultz | |
| 7,026,714 B2 | 4/2006 | Cunningham | |
| 7,062,850 B2 | 6/2006 | Atakov et al. | |
| 7,307,344 B2 | 12/2007 | Minamihaba et al. | |
| 7,407,605 B2 | 8/2008 | Restaino et al. | |
| 7,439,173 B2 | 10/2008 | Greco et al. | |
| 7,451,411 B2 | 11/2008 | Hau-Riege et al. | |
| 7,468,320 B2 | 12/2008 | Hu et al. | |
| 7,471,539 B2 | 12/2008 | Oates et al. | |
| 7,727,892 B2 | 6/2010 | Morrow et al. | |
| 8,056,039 B2 | 11/2011 | Chanda et al. | |
| 8,119,531 B1 | 2/2012 | Arnold et al. | |
| 8,138,604 B2 | 3/2012 | Yang et al. | |
| 8,211,776 B2 | 7/2012 | Horak et al. | |
| 2003/0116439 A1 | 6/2003 | Seo et al. | |
| 2004/0198062 A1 | 10/2004 | Ye et al. | |
| 2006/0040501 A1* | 2/2006 | America | H01L 21/31116 438/706 |
| 2007/0063352 A1 | 3/2007 | Archer, III et al. | |
| 2008/0026567 A1 | 1/2008 | Greco et al. | |
| 2008/0315426 A1 | 12/2008 | Yang et al. | |
| 2009/0053890 A1* | 2/2009 | Bonilla et al. | 438/645 |
| 2009/0174067 A1 | 7/2009 | Lin | |
| 2009/0294973 A1 | 12/2009 | Chanda et al. | |
| 2009/0302476 A1* | 12/2009 | Li | 257/767 |
| 2010/0081276 A1* | 4/2010 | Ishizaka et al. | 438/653 |
| 2010/0084767 A1 | 4/2010 | Yang et al. | |
| 2010/0219512 A1 | 9/2010 | Tada et al. | |
| 2011/0101523 A1 | 5/2011 | Hwang et al. | |
| 2011/0175226 A1 | 7/2011 | Bonilla et al. | |
| 2011/0285021 A1 | 11/2011 | Yang et al. | |
| 2012/0061838 A1 | 3/2012 | Edelstein et al. | |
| 2012/0104610 A1* | 5/2012 | Filippi et al. | 257/750 |
| 2012/0198403 A1 | 8/2012 | Arnold et al. | |

OTHER PUBLICATIONS

I. A. Blech, "Electromigration in Thin Aluminum Films on Titanium Nitride", J. Appl. Phys., vol. 47, 1976, pp. 1203-1208.

L. T. Romankiw, "A Path: From Electroplating Through Lithographic Masks in Electronics to LIGA in MEMS," Electrochimica Acta, vol. 42, Nos. 20-22, pp. 2985-3005, 1997.

R.A. Wachnik, et al.,"Practical Benefits of the Electromigration Short-Length Effect, Including a New Design Rule Methodology and an Electromigration Resistant Power Grid with Enhanced Wireability," Symposium on VLSI Technology Digest of Technical Papers, IEEE, 2000, pp. 220-221.

Sukharev, et al; "A Model for Electromigration-Induced Degradation Mechanisms in Dual-Inlaid Copper Interconnects: Effects of Microstructure;" Journal of Applied Physics, 102; 2007; pp. 053505-1-053505-14, (pp. 1-14).

L. T. Romankiw, A path: From Electroplating Through Lithographic Masks in Electronics to LIGA in MEMS, Electrochimica Acta, vol. 42, Nos. 20-22, pp. 2985-3005, 1997.

\* cited by examiner

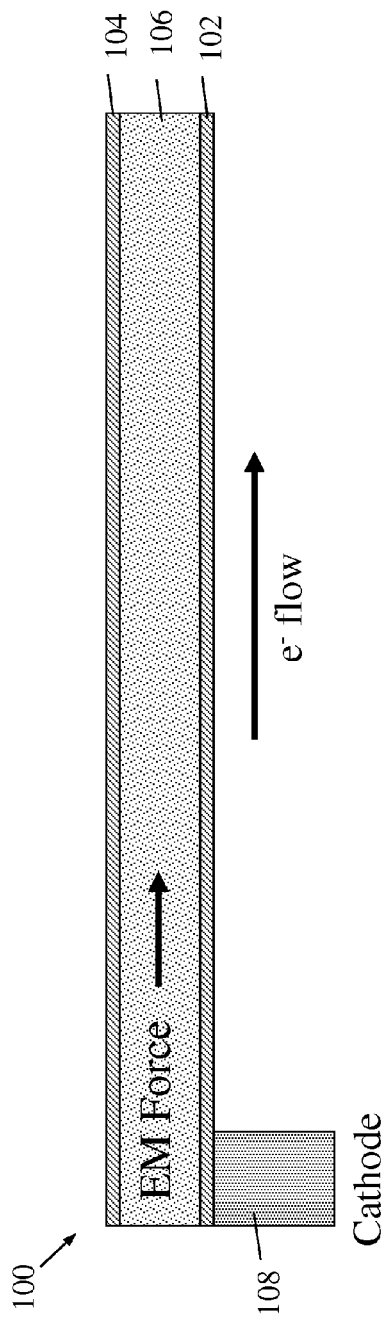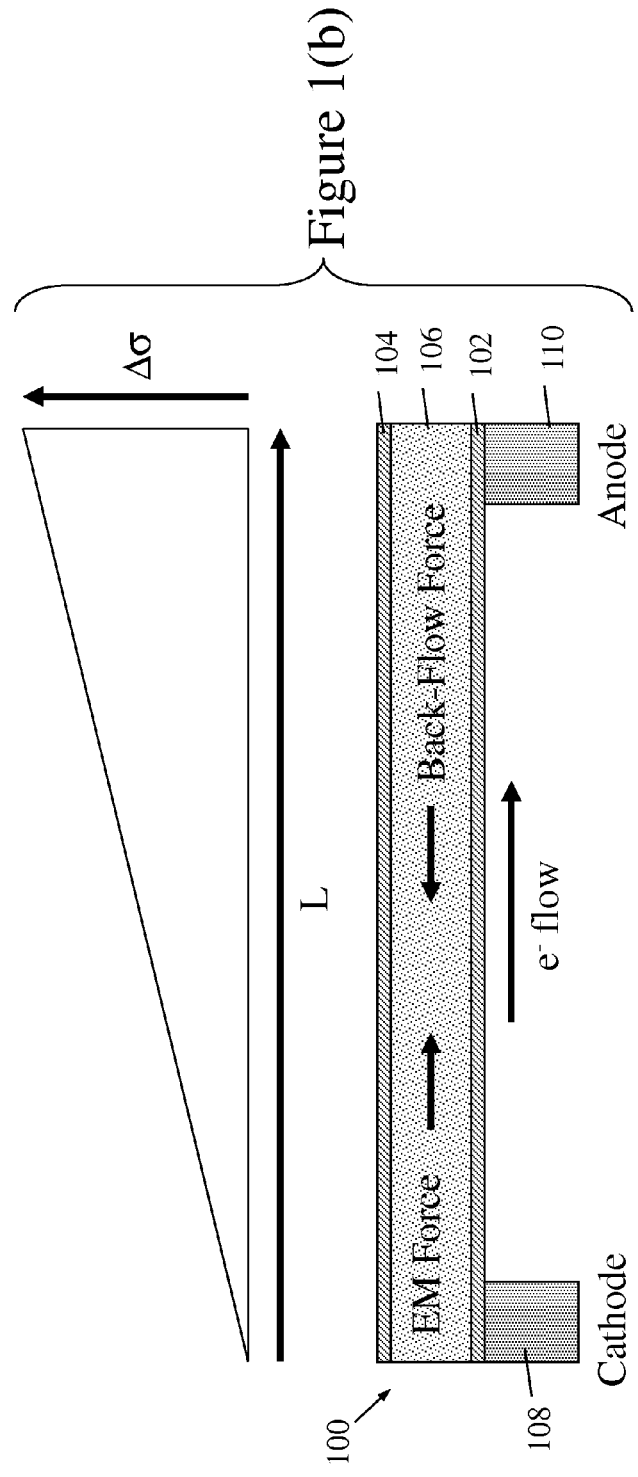
Figure 1(a)
Figure 1(b)

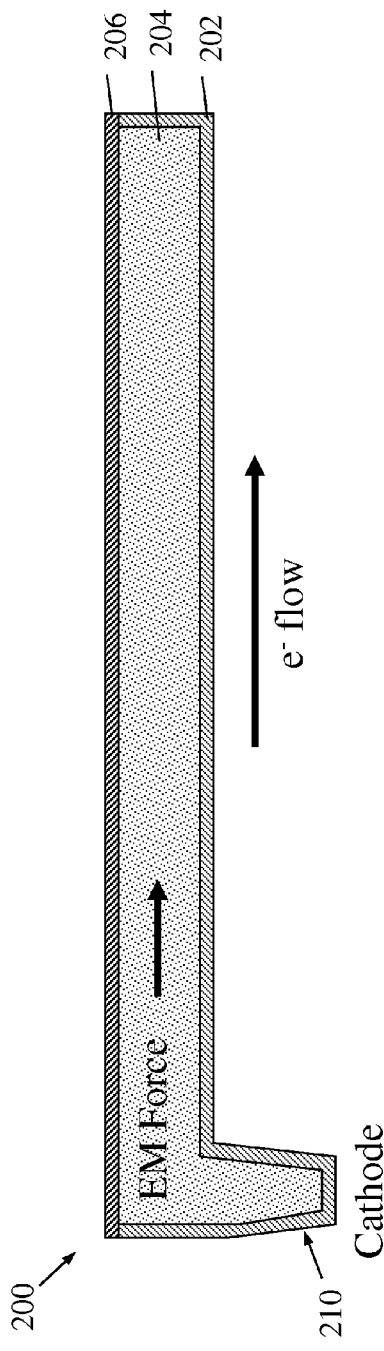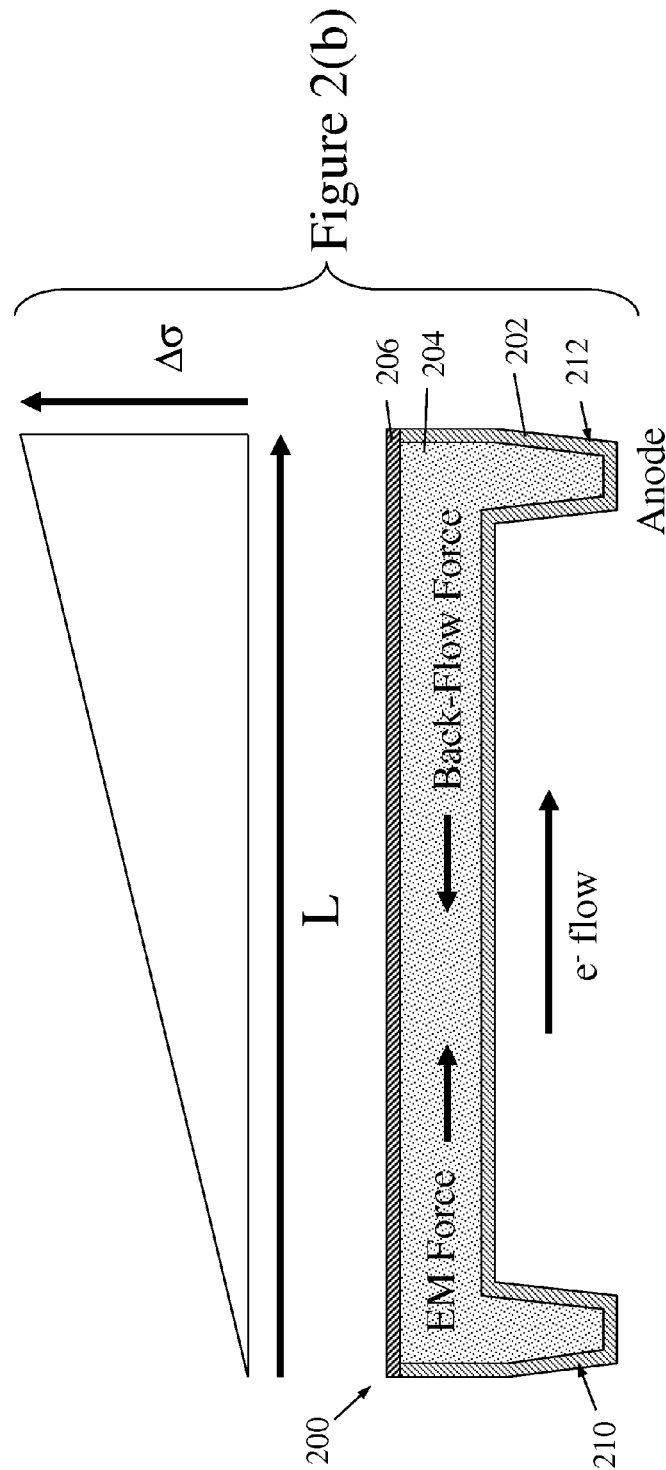

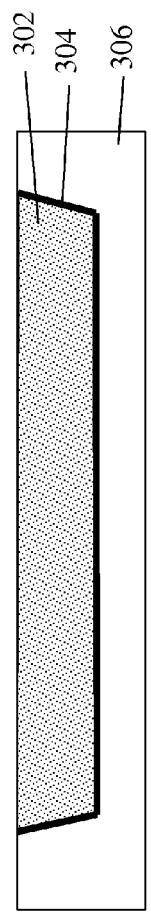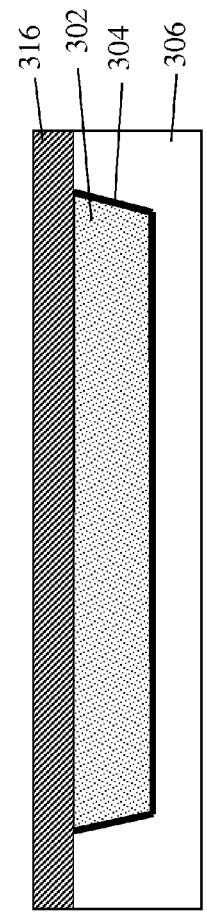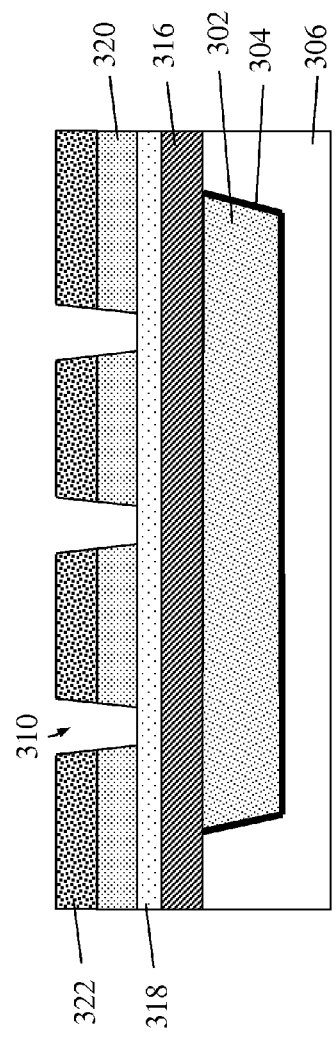
Figure 8
Figure 9
Figure 10

SELECTIVE LOCAL METAL CAP LAYER FORMATION FOR IMPROVED ELECTROMIGRATION BEHAVIOR

DOMESTIC PRIORITY

This application is a divisional of U.S. patent application Ser. No. 13/964,772, filed Aug. 12, 2013, which is a continuation-in-part of U.S. patent application Ser. No. 13/744,705, filed Jan. 18, 2013, the disclosure of which is incorporated by reference herein in its entirety.

BACKGROUND

The present disclosure relates generally to semiconductor device manufacturing techniques and, more particularly, to the formation of interconnect structures with selective local metal cap regions for improved electromigration behavior.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of unidirectional or DC electrical current conduction therethrough. More specifically, the electron current collides with the diffusing metal atoms, thereby pushing them in the direction of current travel. Over an extended period of time, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design, as relative current densities through metallization lines continue to increase as the linewidth dimensions shrink.

SUMMARY

In an exemplary embodiment, a method of forming a wiring structure for an integrated circuit device includes forming a first metal line within an interlevel dielectric (ILD) layer, and forming a second metal line in the ILD layer adjacent the first metal line; masking selected regions of the first and second metal lines; selectively plating metal cap regions over exposed regions of the first and second metal lines at periodic intervals such that a spacing between adjacent metal cap regions of an individual metal line corresponds to a critical length, L, at which a back stress gradient balances an electromigration force in the individual metal line, so as to suppress mass transport of electrons; and wherein the metal cap regions of the first metal line are formed at staggered locations with respect to the metal cap regions of the second metal line, along a common longitudinal axis.

In another embodiment, a first metal line formed within an interlevel (ILD) dielectric layer; a second metal line formed in the ILD layer adjacent the first metal line; a plurality of metal cap regions formed over the first and second metal lines at periodic intervals such that a spacing between adjacent metal cap regions of an individual metal line corresponds to a critical length, L, at which a back stress gradient balances an electromigration force in the individual metal line, so as to suppress mass transport of electrons; and wherein the metal cap regions of the first metal line are formed at staggered locations with respect to the metal cap regions of the second metal line, along a common longitudinal axis.

BRIEF DESCRIPTION OF THE SEVERAL VIEWS OF THE DRAWINGS

Referring to the exemplary drawings wherein like elements are numbered alike in the several Figures:

FIG. 1(a) is a schematic diagram illustrating the direction of electromigration force and electron flow away from the cathode end of IC interconnect structure, leading to migration of atoms from the cathode end;

FIG. 1(b) is another schematic diagram illustrating both electromigration force and a stress-induced back flow of atoms when diffusion barriers are located at both cathode and anode ends of an interconnect structure;

FIGS. 2(a) and 2(b) are Dual Damascene copper versions of the examples shown in FIGS. 1(a) and 1(b), respectively;

FIGS. 3 through 7 are a series of cross sectional views illustrating the formation of interconnect structures with selective local metal cap regions in accordance with an exemplary embodiment, in which:

FIG. 3 illustrates the formation of a copper metal line and associated liner material within an interlevel dielectric (ILD) layer, post planarization of the metal;

FIG. 4 illustrates the formation of a nitrogen-doped silicon carbide film over the structure of FIG. 3;

FIG. 5 illustrates patterning of the nitrogen-doped silicon carbide film to define openings corresponding to desired locations of metal cap regions;

FIG. 6 illustrates selective electroless plating/deposition of metal cap regions over exposed portions of the copper metal line;

FIG. 7 illustrates the formation of a conformal nitride layer over the structure of FIG. 6;

FIGS. 8 through 16 are a series of cross sectional views illustrating the formation of interconnect structures with selective local metal cap regions in accordance with another exemplary embodiment, in which:

FIG. 8 illustrates the formation of a copper metal line and associated liner material within an ILD layer, post planarization of the metal;

FIG. 9 illustrates the formation of a hydrogen doped silicon nitride film over the structure of FIG. 8;

FIG. 10 illustrates the formation of a titanium nitride metal hardmask, a low temperature oxide (LTO) layer and an organic planarizing layer (OPL) over the structure of FIG. 9, followed by patterning of the LTO layer and OPL to define openings corresponding to desired locations of metal cap regions;

FIG. 11 illustrates transfer of the pattern through the hardmask layer and partially into the hydrogen doped silicon nitride film, followed by removal of the LTO layer and OPL layer;

FIG. 12 illustrates removal of the hardmask layer;

FIG. 13 illustrates transfer of the pattern through the hydrogen doped silicon nitride film, which partially recesses the copper layer;

FIG. 14 illustrates selective electroless plating/deposition of metal cap regions over exposed portions of the copper metal line;

FIG. 15 illustrates removal of the hydrogen doped silicon nitride film;

FIG. 16 illustrates the formation of a nitrogen-doped silicon carbide layer over the structure of FIG. 15;

FIGS. 17 through 24 are a series of cross sectional views illustrating the formation of interconnect structures with selective local metal cap regions in accordance with another exemplary embodiment, in which:

FIG. 17 illustrates the formation of a copper metal line and associated liner material within an ILD layer, post planarization of the metal;

FIG. 18 illustrates the formation of a bottom antireflective coating (BARC) layer over the structure of FIG. 17;

FIG. 19 illustrates the formation of a photoresist layer over the BARC layer;

FIG. 20 illustrates the patterning of the photoresist layer;

FIG. 21 illustrates isotropic wet etching of the exposed BARC layer to expose the metal line;

FIG. 22 illustrates selective electroless plating/deposition of a metal cap over the exposed copper metal line;

FIG. 23 illustrates removal of remaining portions of the BARC and photoresist layers;

FIG. 24 illustrates the formation of a nitrogen-doped silicon carbide layer over the structure of FIG. 23;

FIGS. 25 through 29 are a series of cross sectional views illustrating the formation of interconnect structures with selective local metal cap regions in accordance with another exemplary embodiment, in which:

FIG. 25 illustrates the formation of a photo-developable BARC layer and a photoresist layer over the structure of FIG. 17;

FIG. 26 illustrates the patterning of the both the photoresist and BARC layers;

FIG. 27 illustrates selective electroless plating/deposition of a metal cap over the exposed copper metal line;

FIG. 28 illustrates removal of remaining portions of the BARC and photoresist layers;

FIG. 29 illustrates the formation of a nitrogen-doped silicon carbide layer over the structure of FIG. 28;

DETAILED DESCRIPTION

Figure 3:
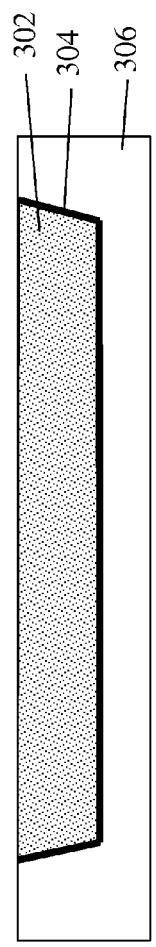

As indicated above, electromigration (EM) is a reliability failure mechanism for metal interconnects in which metal atoms migrate under the influence of the electric field and electron flow. For the case of aluminum (Al) and copper (Cu) interconnects, the electromigration mass flow is in the direction of electron flow. During electromigration, the electron wind applies a force that results in an atomic flux, J, given by the following equation:

$$J = nv_e = n\left(\frac{D}{kT}\right)j\rho eZ^* \quad \text{(Eq. 1)}$$

where n is the density of atoms, $v_e$ is the drift velocity of migrating atoms, D is the effective diffusivity, k is Boltzmann's constant, T is the absolute temperature, j is the current density, $\rho 0$ is the resistivity and $eZ^*$ is the effective ion charge. FIG. 1(a) illustrates a situation where the EM force is in the same direction as the electron flow for a multilayer aluminum copper (AlCu) interconnect structure 100 including lower refractory layer 102 (e.g., titanium (Ti), titanium nitride (TiN), tungsten (W)), AlCu layer 106, upper refractory layer 104, and a W stud 108 located at the cathode end of the line. The migration of atoms from the cathode end leads to void formation in this region, which eventually causes a resistance increase in the line.

However, in the presence of a diffusion barrier, atoms accumulate at the anode end and deplete the cathode end of the conductor, leading to a stress gradient and back diffusion of atoms (see, for example, I. A. Blech, J. Appl. Phys. 47, 1203 (1976)). The combination of electromigration and the stress-induced back flow of atoms gives rise to a net atomic flux, $J_{eff}$, given by the following equation at steady state:

$$J_{eff} = n(v_e - v_b) = \frac{nD}{kT}\left(j\rho eZ^* - \frac{\Delta\sigma\Omega}{L}\right) \quad \text{(Eq. 2)}$$

where $v_b$ is the back flow velocity of atoms, $\Delta\sigma$ is the difference in stress between the cathode and the anode ends, $\Omega$ is the atomic volume and L is the conductor length. As illustrated in FIG. 1(b), a linear stress gradient develops after a certain period of time under steady state conditions. It is thus necessary to have a diffusion blocking material, such as W, located at both ends of the line in order for the stress to develop in those regions. In particular, FIG. 1(b) illustrates another tungsten stud 110 located at the anode end of the interconnect structure 100.

When the back stress gradient balances the electromigration force, mass transport is completely suppressed. This phenomenon is referred to as the electromigration threshold or the short-length effect, and occurs for sufficiently short interconnects and low current densities. The threshold condition is defined from the above relation for $J_{eff}$ such that:

$$(jL)_{th} = \frac{\Delta\sigma\Omega}{\rho eZ^*} \quad \text{(Eq. 3)}$$

where $(jL)_{th}$ is referred to as the threshold length product. For jL values less than $(jL)_{th}$, there is no electromigration failure in the interconnect structure. If j and L correspond exactly to the threshold condition, then the length of the interconnect corresponds to what is referred to as the critical length. The short-length effect has been observed in AlCu interconnects with W interlevel studs, as well as in Dual Damascene Cu interconnects with interlevel vias, wherein the Dual Damascene interconnects utilize liner materials such as tantalum (Ta), tantalum nitride (TaN), Ti, TiN, W, ruthenium (Ru), ruthenium nitride (RuN), and tungsten nitride (WN), for example as diffusion barriers.

FIGS. 2(a) and 2(b) are Dual Damascene Cu versions of the examples shown in FIGS. 1(a) and 1(b), respectively. More specifically, FIG. 2(a) illustrates interconnect structure 200 including liner layer 202 (for preventing Cu diffusion), Dual Damascene Cu via/trench fill layer 204, and cap layer 206, with a filled via 210 located at the cathode end of the line. Exemplary cap layer materials may include, for example, dielectric materials such as silicon nitride ($Si_3N_4$), silicon carbide (SiC) or silicon carbide nitride (SiCN). Alternatively, metal cap materials such as Ta, TaN, Co, cobalt tungsten phosphide (CoWP) or Ru may also be used, depending upon the technology. In FIG. 2(b), a blocking material, such as the liner material 202 is included within another filled via 212 located at the anode end of the interconnect structure 200.

Regardless of the specific type of via and interconnect metal(s) used, one way to take advantage of the short-length effect is to simply design short interconnects since the allowed current density increases as the conductor length decreases. However, this approach has limitations since the design of "short" interconnects (by definition) requires more interlevel vias, which in turn may cause yield degradation as well as increases in resistance. Therefore, it would be beneficial to design a layout that can tolerate higher current densities without significantly reducing the conductor length.

It is also known that, for Dual Damascene Cu interconnects, the main diffusion path leading to electromigration failure is along the Cu/dielectric cap interface. Studies have shown that the electromigration lifetime is dramatically increased by depositing a metal cap layer on the Cu lines as the rate of Cu diffusion is much lower along the Cu/metal cap interface. Again, exemplary materials for the metal cap may include CoWP, Ta, Ru, Co or other materials. One of the concerns, however, with implementing a metal cap layer is the risk of depositing some metal cap material in dielectric regions between the Cu lines. Although the metal cap deposition is intended to be selective, some metal particles may actually be deposited between the Cu lines, leading to early time dependent dielectric breakdown (TDDB) failure.

One of the more popular electroless capping processes for BEOL semiconductor copper wiring (as described above) includes selective electroless deposition of a thin cap (e.g., 100 Å or less) of CoWP. There is, however, one disadvantage in using CoWP, since it has been found to increase line RC (resistance times capacitance), which can degrade circuit performance. There are two apparent reasons for RC increases. First, the CoWP process raises the resistance of the copper lines, as measured at final test, by apparently stabilizing the microstructure enough to prevent the significant resistance decrease that is normally observed by final test (and attributed to subsequent anneals as more wiring levels are added, which involve deposition processes at elevated temperatures).

Second, the CoWP process can also increase capacitance, by making the lines stand taller. The exact amount of capacitance increase will depend on exactly how the CoWP process is run. Typically, the process involves removal of a tiny amount of Cu (in addition to any native Cu oxide from the tops of the copper lines) by a wet clean before the actual cap deposition process begins, to ensure that an oxide free copper surface is exposed. If the thickness of the CoWP cap is greater than the thickness of Cu removed, then the metal line after capping will necessarily stand taller and therefore have greater capacitance. It has been observed for 32 nanometer (nm) technology that thin wires capped with CoWP are typically about 10% higher in RC at final test than thin wires not capped with CoWP.

Accordingly, embodiments disclosed herein provide methods and structures for depositing a metal cap layer at periodic intervals such that the distance between metal cap layers is equal to the critical length. Since the diffusivity is lower for the Cu/metal cap interface than for the Cu/dielectric cap interface, regions having a metal cap will act as a diffusion barrier. Such a design may be implemented to increase the allowed current density, and without the need for introducing additional interlevel vias. Notably, electromigration improvement may still occur if the distance between metal cap layers is greater than the critical length, as the presence of a metal cap layer will prevent electromigration failure from occurring in those regions. On the other hand, having the distance between metal cap layers equal to the critical length will also prevent electromigration failure from occurring in the regions without a metal cap layer.

Further embodiments disclosed herein involve lithographic masking prior to electroless metal capping, using a mask designed to allow capping of those areas where electromigration concerns override RC concerns, but not of those areas where the desire for low RC overrides electromigration concerns. Some specific examples of criteria for choosing these areas are described in further detail below. The mask design to be used may be varied from level to level. In general, embodiments of this type involve coating the wafer (after the complete Cu and liner CMP process is performed) with a bottom antireflective coating (BARC) that is on the order of a few hundred to one thousand Å in thickness, followed by a photoresist which is on the order of one thousand to a few thousand Å in thickness, exposing the resist through the mask, and developing the resist. The BARC is then opened in the areas where the resist has been removed by the developer.

Referring generally now to FIGS. 3 through 7, there are shown a series of cross sectional views illustrating the formation of interconnect structures with selective local metal cap regions in accordance with an exemplary embodiment. In this exemplary approach, a dielectric cap is patterned (opened) in selected regions where a metal cap is to be deposited. In this manner, the resulting structure will not include residual metal cap material between the Cu lines at the Cu/dielectric cap interface since those regions are covered by initial dielectric cap layer.

Figure 4:
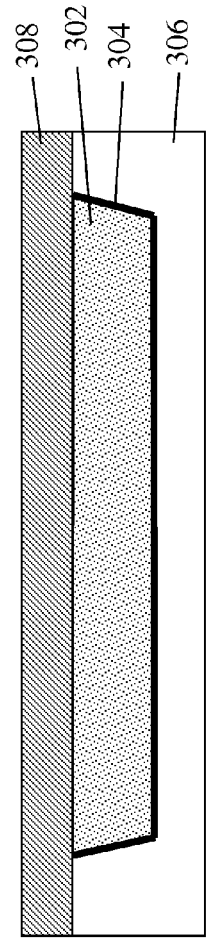
Figure 5:
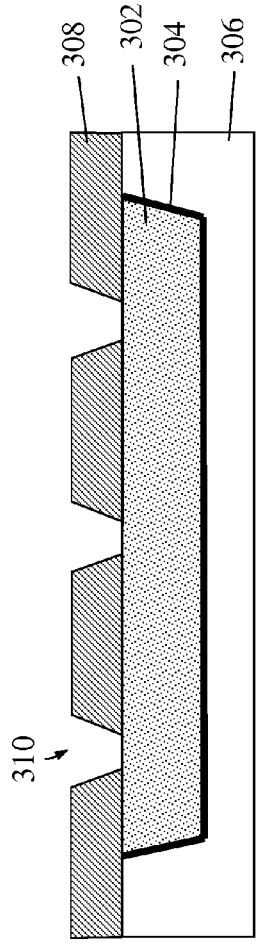

As particularly shown in FIG. 3, a copper metal line 302 and associated liner material 304 (e.g., Ta, TaN, Ti, TiN, Ru, RuN, etc.) are formed within an interlevel dielectric (ILD) layer 306, as known the art. The liner material 304 and copper line 302 are planarized to the top surface of the ILD layer 306. An insulating dielectric cap layer 308, such as a nitrogen-doped silicon carbide (N-Blok) film is deposited over the copper line 302 and ILD layer 306 as shown in FIG. 4. Then, as shown in FIG. 5, the nitrogen-doped silicon carbide film 308 is lithographically patterned so as to define openings 310 corresponding to desired locations of metal cap regions. The patterning may be implemented by, for example, an anisotropic, dry reactive ion etch (RIE) process where sputtering of copper and insulator onto resist sidewalls is not a significant concern. Alternatively, an isotropic wet etch process may be used to remove patterned portions of the nitrogen-doped silicon carbide film 308 where high resolution is not a significant concern.

Figure 6:
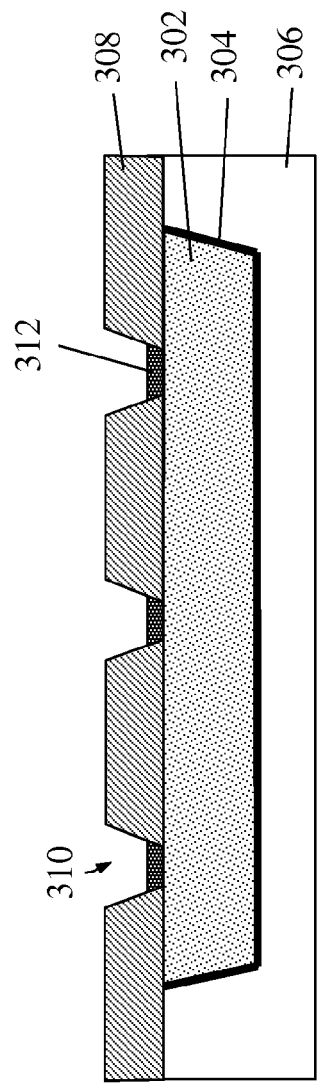
Figure 7:
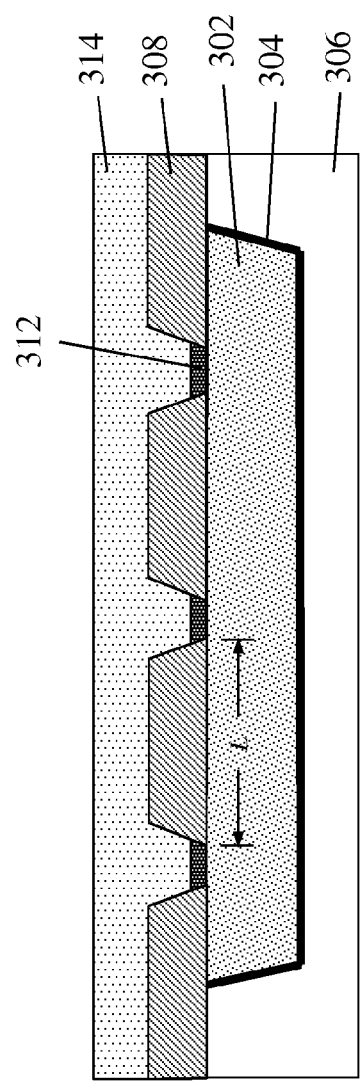

Referring to FIG. 6, exposed portions of the copper metal line are provided with intermittent metal cap regions 312 formed, for example, by selective electroless plating or deposition of metal material. In the case of CoWP, the cap regions 312 may be formed by electroless plating, and in the case of cobalt (Co) for example, the metal cap regions 312 may be formed by chemical vapor deposition (CVD). In an exemplary embodiment, the metal cap regions 312 have a thickness on the order of about 50 angstroms (Å) to about 100 Å. Once the metal cap regions 312 are selectively formed, a conformal nitride layer 314 is formed over the structure as shown in FIG. 7. From this point, additional back end of line (BEOL) processing as known in the art may continue.

As further illustrated in FIG. 7, the distance between metal cap regions 312 is L or the critical length. For j=12 mA/µm² and $(jL)_{th}$=120 mA/µm, the critical length is 10 µm. The rate of Cu diffusion is much lower along a Cu/metal cap interface than along Cu/dielectric cap interface, and the rate of Cu diffusion is also much lower along Cu/liner interface and through Cu bulk.

Another exemplary embodiment for forming intermittent metal cap regions, in addition to the dielectric cap-open approach described above includes the use of a sacrificial hardmask. In this regard, FIGS. 8 through 16 are a series of cross sectional views illustrating the formation of interconnect structures with selective local metal cap regions in accordance with another exemplary embodiment. Here, a metal hardmask (e.g., TiN) is used to pattern and define dielectric cap regions where metal cap material is to be deposited. As is the case with the first embodiment, the resulting structure will not have residual metal cap material between the Cu lines.

FIG. 8 illustrates a similar point in a process flow as shown in FIG. 3, which illustrates the formation of a copper metal line 302 and associated liner material 304 within an ILD layer 306, post planarization of the metal. For ease of description, the same reference numerals are used to describe similar materials used in the various embodiments discussed herein. In FIG. 9, a hydrogen-doped, silicon nitride (SiNH) film 316 is formed over the copper line 302 and ILD layer 306. Where, for example, the ILD layer is a silicon dioxide (SiO₂) layer, the SiNH film 316 has a dilute hydrofluoric (DHF) etch rate of about 90 times that of the ILD layer 306.

Figure 11:
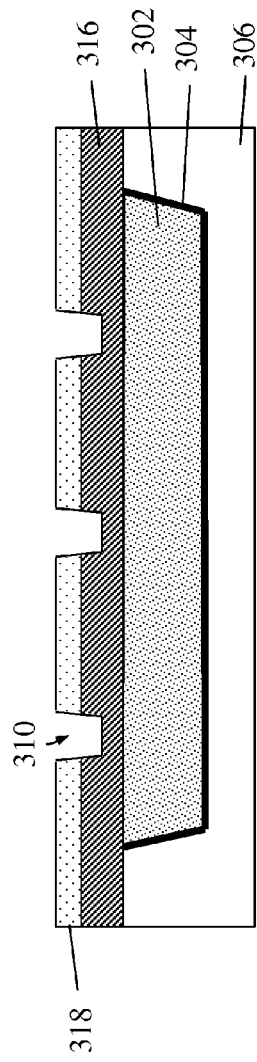

Referring to FIG. 10, additional layers are formed over the SiNH film 316 to serve as a hardmask stack to protect against possible resist poisoning. These layers may include, for example, a titanium nitride (TiN) metal hardmask layer 318, a low temperature oxide (LTO) layer 320 and an organic planarizing layer (OPL) 322. FIG. 10 further depicts patterning of the LTO layer 320 and OPL 322 to define openings 310 corresponding to desired locations of metal cap regions. Then, as shown in FIG. 11, the pattern is transferred through the hardmask layer 318 and partially into the hydrogen doped silicon nitride film 316, followed by removal of the LTO layer and OPL layer (such as by ashing, for example).

Figure 12:
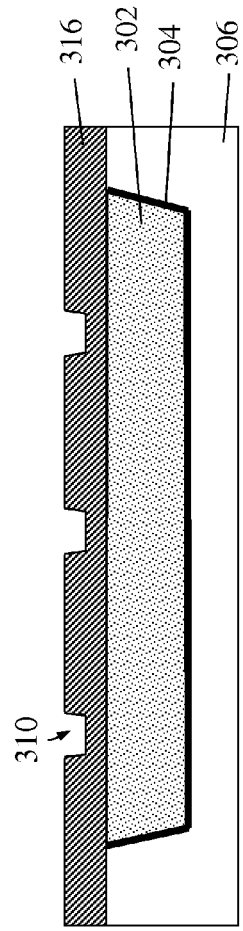
Figure 13:
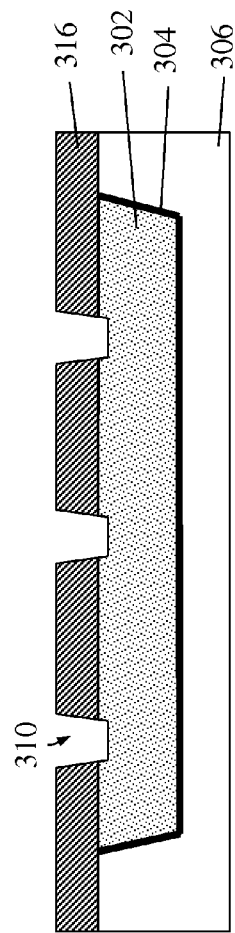
Figure 14:
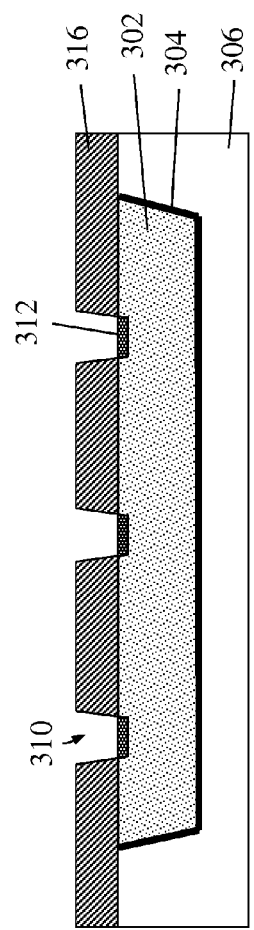
Figure 15:
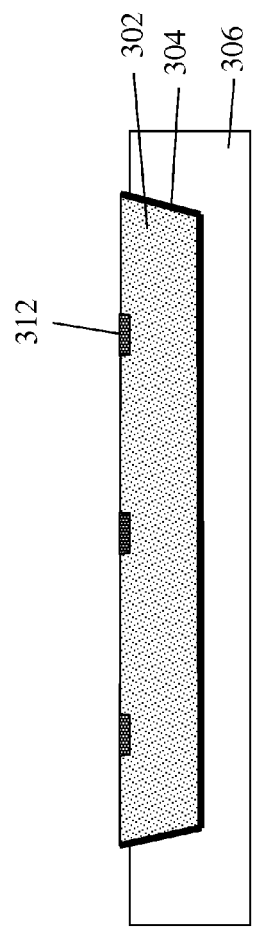
Figure 16:
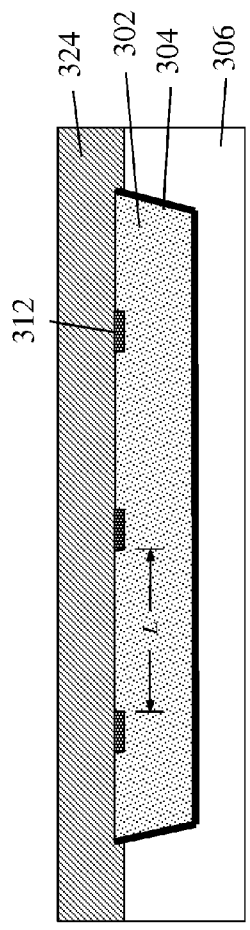

FIG. 12 illustrates the removal of the hardmask layer, such as by a chlorine based RIE to remove the TiN film. Then, as shown in FIG. 13, the pattern is transferred completely through the SiNH film, such as by a carbon tetrafluoride (CF₄) blanket etch followed by a post RIE clean (e.g., with H₂O), which also may partially recess the copper layer 302. At this point, selective electroless plating/deposition of metal cap regions 312 may be performed over exposed portions of the copper metal line 302, as shown in FIG. 14. As is the case with the first embodiment, the thickness of the metal cap regions 312 may be on the order of about 50 Å to about 100 Å. In contrast to the first embodiment, the metal cap regions 312 are recessed below a top surface of the copper metal line 302. Once the metal cap regions 312 are formed, the remaining portions of the SiNH film 316 may be removed (e.g., by DHF etch), as shown in FIG. 15. This may result in a slight recessing of the ILD layer 306. Then, in FIG. 16, a nitrogen-doped silicon carbide layer 324 is formed over the structure of FIG. 15, after which processing as known in the art may continue. As is the case for the first embodiment, the distance between metal cap regions 312 is L or the critical length.

Among the advantages of the embodiments described above in forming metal cap layers at periodic intervals (e.g., cap open process, sacrificial hardmask process) include, in addition to electromigration improvement, a resulting structure that does not have residual metal cap material between the Cu lines at the Cu/dielectric cap interface. Also, TDDB concerns are alleviated even if some residual material is deposited between the nitrogen-doped silicon carbide layer and the conformal nitride layer, since this will not be the path for TDDB failure.

Referring now to FIGS. 17 through 24, there is shown a series of cross sectional views illustrating the formation of interconnect structures with selective local metal cap regions in accordance with another exemplary embodiment. Once again, where applicable, the same reference numerals are used to describe similar materials used in the various embodiments discussed herein.

Figure 17:
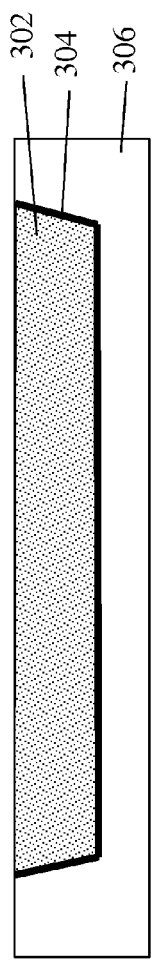
Figure 18:
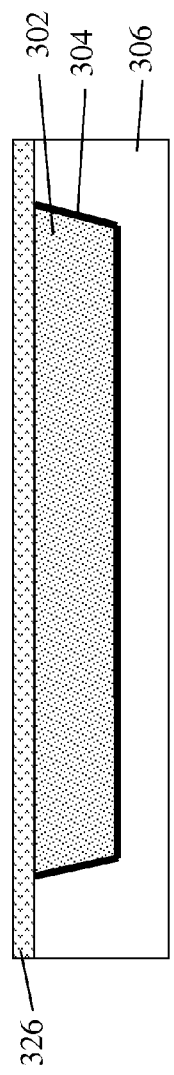
Figure 19:
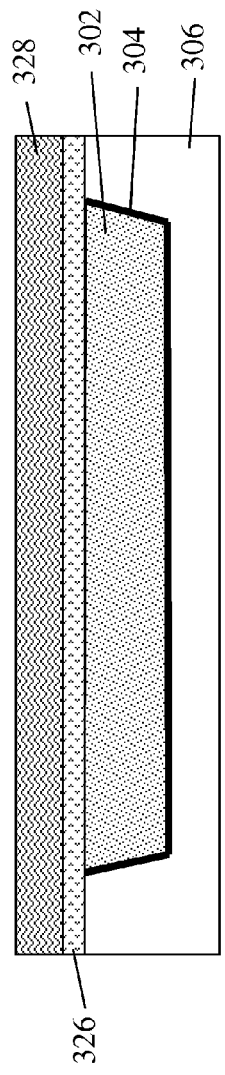

FIG. 17 (similar to FIGS. 3 and 8) illustrates the formation of a copper metal line 302 and associated liner material 304 within an ILD layer 306, post planarization of the metal. In FIG. 18, a BARC layer 326 is formed over the structure of FIG. 17, followed by a photoresist layer 328 over the BARC layer 326 in FIG. 19.

Figure 20:
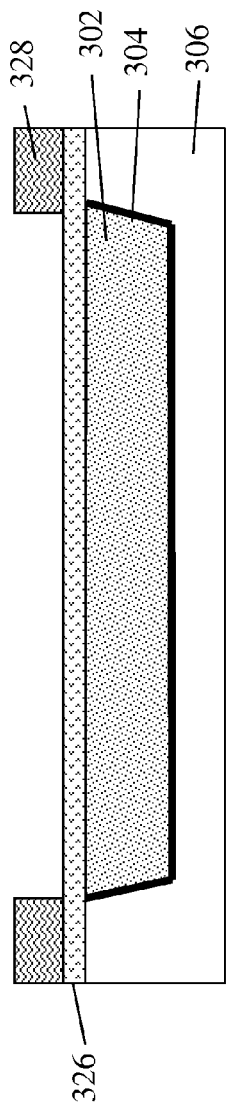
Figure 21:
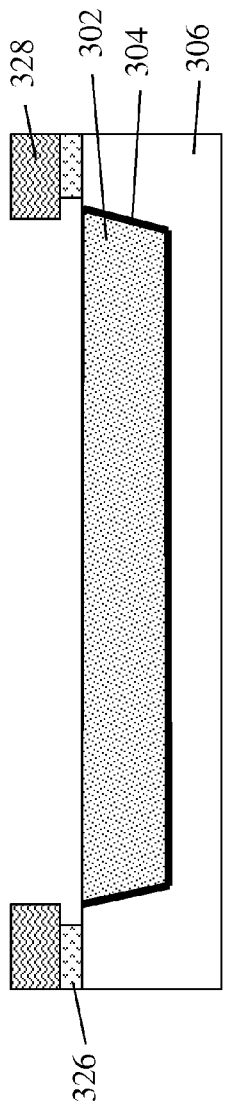

FIG. 20 illustrates the patterning of the photoresist layer 328. In this embodiment, the concern for electromigration in line 302 overrides increased RC concerns. As shown in FIG. 21, a wet etch process (e.g., chemical solvent, aqueous base, etc.) is used to isotropically open the BARC layer 326 and expose the metal line 302. Alternatively, the BARC layer 326 may also be dissolvable in the resist developer, such that a second chemical to remove the BARC layer 326 is not needed. Both of these wet etch processes to open the BARC layer 326 are isotropic in nature, (i.e., etching the BARC downward and sideways at the same time). In still another embodiment, the BARC layer 326 may be subjected to a dry RIE process in lieu of a wet etch process.

Figure 22:
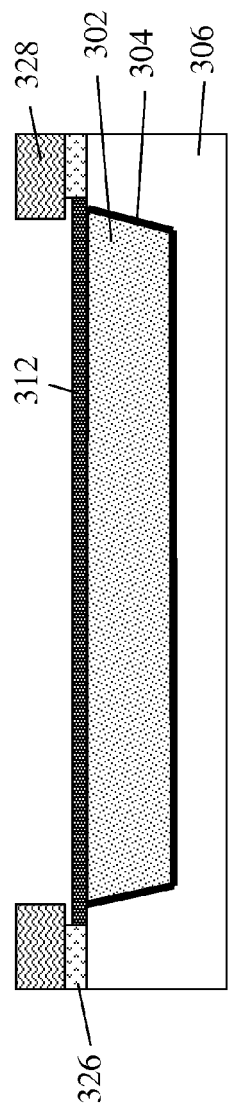
Figure 23:
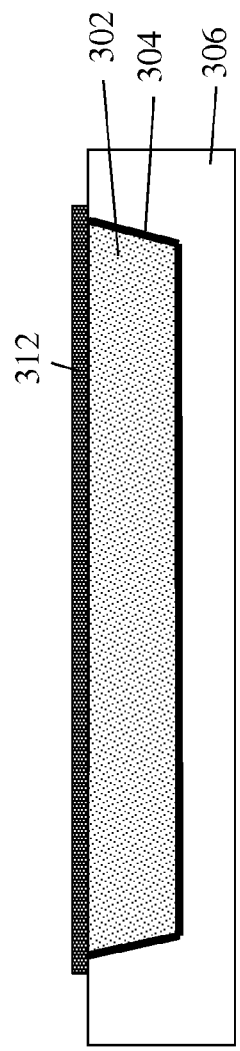
Figure 24:
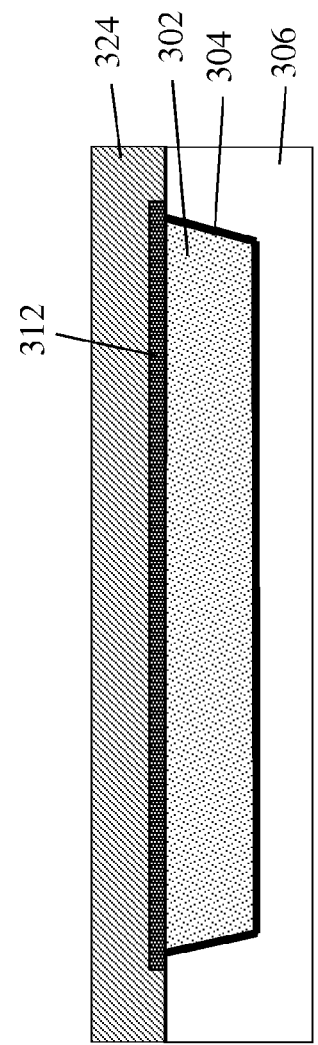

FIG. 22 illustrates selective electroless plating/deposition of a metal cap (e.g., CoWP) over the exposed copper metal line 302. In FIG. 23, remaining portions of the BARC and photoresist layers are removed prior to deposition of a nitrogen-doped silicon carbide layer 324 as shown in FIG. 24. From this point, processing may continue as known in the art.

Figure 25:
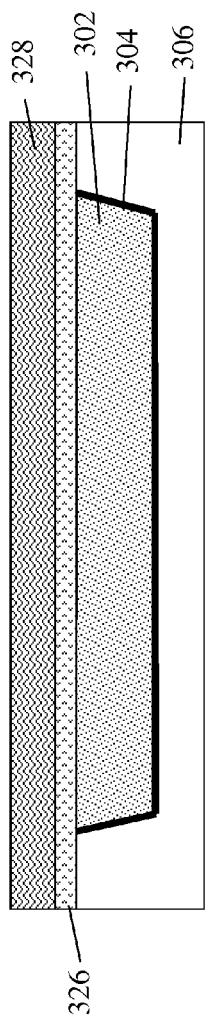
Figure 26:
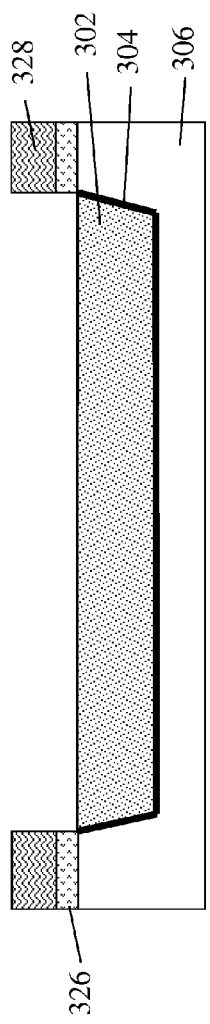
Figure 27:
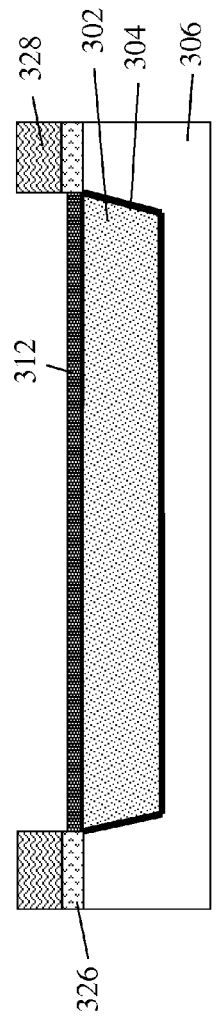
Figure 28:
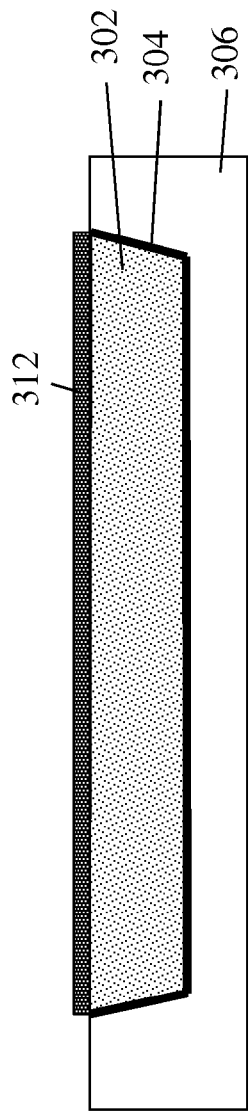
Figure 29:
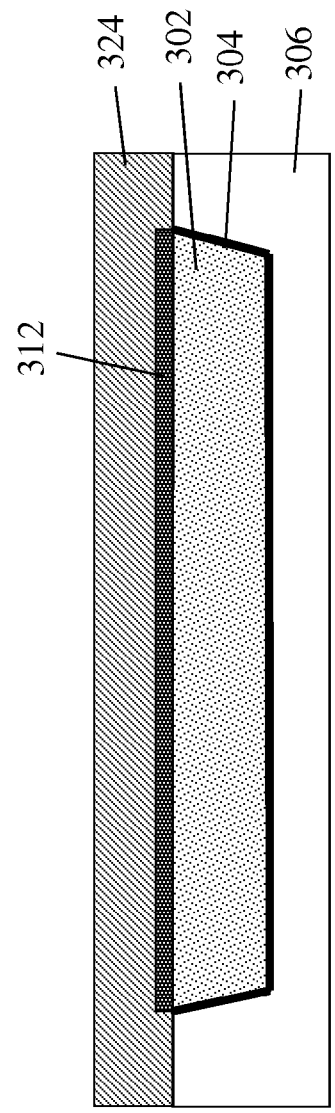

Still another possibility is to use a BARC 326 which is both photoactive and developable at the same time that the resist is developed, as shown in FIG. 25. In this sense, the BARC is itself a photoresist (although a relatively thin one), and therefore it can have a relatively high absorbance at the exposure wavelength. Image resolution down to 110 nm has been reported with a photoactive BARC. After the BARC 326 and resist 328 are opened by one of the wet methods described above in FIG. 26, the normal electroless CoWP process would then be performed to deposit the CoWP layer 312 only in the opened areas (it is known that resist materials can withstand plating processes), as shown in FIG. 27. The resist and BARC would then be dissolved away by the appropriate wet processing, either in a wet module attached to the plating tool or in a standalone wet tool, as shown in FIG. 28. After deposition of the nitrogen-doped silicon carbide layer 324 as shown in FIG. 29, processing may continue as known in the art.

Masks used in the exemplary processes depicted in conjunction with any of FIGS. 3-29 may be designed such that areas not prone to electromigration failure would not be capped with CoWP or other metal, so that these areas could take advantage of the lowest possible RC. In general, metal wires which pass only alternating current (AC) do not suffer from electromigration problems. In addition, short wires, or metal shapes of small area, are also much less prone to electromigration failure than longer wires, as also described earlier. For example, the embodiments of FIGS. 3-16 could be performed on all lines of a device, or just for those lines that carry DC current. In another example, the embodiments of FIGS. 17-29 could be applied to all DC current carrying lines, or perhaps only those DC current carrying lines in certain regions of the lines that are separated by diffusion length L.

Although the resolution of the exemplary wet processes described above would not be sufficient to resolve individual nested wires or individual nested metal shapes at minimum pitch for 32 nm nodes or below, a wet process with 110 nm resolution as referenced would allow groups of several wires (or larger "blocks" of circuitry) to be masked off to prevent CoWP deposition, or to receive CoWP while other areas do not receive it. One example would be to block CoWP deposition in SRAM cell areas, where most metal shapes are small, while allowing CoWP deposition, if desired, in SRAM support circuitry and other surrounding areas. The SRAM cell could therefore take advantage of the lowest possible metal RC to give the lowest possible switching delays.

As mentioned earlier, long lines are generally more prone to electromigration failure than short lines. If so desired, a mask could be designed such that long lines (longer than the resolution limit of the masking process) could receive CoWP along some but not all of their length, preferably in regions separated by diffusion length L, to achieve some degree of "compromise" between electromigration enhancement and RC minimization.

There are various methods for determining where in a design (by spatial position and by metal level) it would be most beneficial to deposit or not deposit CoWP, and of automating the design of the masks to be used prior to the CoWP capping process. Metal shapes sensitive or insensitive to RC changes can be understood in a number of ways. The schematic portion of a design gives a very clear understanding of the power (DC) distribution. Typically, these nets are marked with a net name that can be used in a post processing algorithm (dataprep) to distinguish ground nets and $V_{dd}$ nets from all other nets. Once that understanding is clear, a mask layer can be created to open up the resist to deposit the CoWP in the desired places. A "resolution limit" (for example, 110 nm as discussed above) could be included as part of the mask generation process flow, such that areas (to be masked or not masked) that are smaller than this resolution limit could be automatically deleted from the mask design if so desired.

Additionally, modern VLSI designs have multiple voltage domains. Each of these domains must have independent net names for power rails, potentially enabling CoWP to be deposited or not deposited as a function of domain voltage if so desired. Another method of identifying nets is to examine the timing report. The output of the timing report typically contains wiring delay sensitivity information to help the designer understand how to improve/close timing from a physical layout perspective. Nets that are associated with a timing run that show a high sensitivity to wiring delay should not be capped with CoWP.

Still another method would allow the designer to place marker levels in their design. These marker levels would be coincident with metal layers where the designer wanted increased resistance to electromigration. Parasitic Extraction (PEX) could then be updated to provide the designers with accurate resistance/capacitance in the extracted netlist and used during formal design verification closure and timing closure. Design rules could be used, if needed, to govern how the marker shapes could be placed (for example, a rule for minimum space between adjacent marker shapes, which would depend on the resolution of the masking process).

Figure 30:
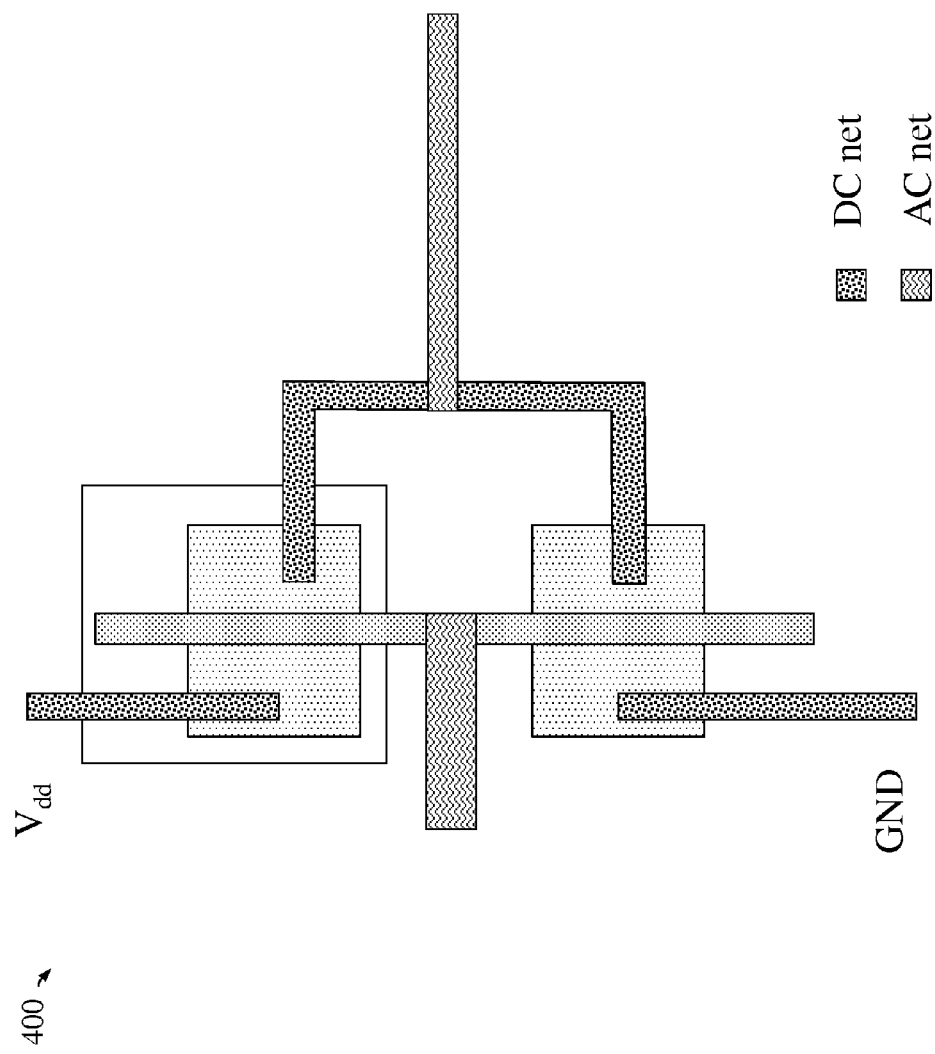
FIG. 30 is a schematic layout view of an exemplary circuit having first regions where a metal cap is formed over wiring and second regions where no metal cap is formed over wiring.

Still another method would be to base the decision on the current densities in each metal shape during circuit operation. Current density can change along the length of a wire as the polygon changes, and as multiple nodes come and go. Current density analysis may be back annotated from the schematic analysis into physical layout (polygons) noting regions where high current densities exist. Furthermore, a single metal polygon 400 may have both DC and AC regions thereon (FIG. 30), further complicating the analysis, but also adding to the value of the technique. Simple threshold rules can then be set that translate current density regions into shapes that can be used to control where CoWP is deposited. Finally, another exemplary method may be to trace the power connections from packaging requirements and definitions of which nodes are power and ground.

As discussed above, it has been observed that metal capping may deteriorate TDDB reliability due to capping metal residues between neighboring interconnects. The previously described embodiments have addressed this issue by proposing segments of metal capping to significantly reduce the amount of capping metal deposited. In such case, the distance L between metal cap regions 312 on the same interconnect is kept less than the Blech length in order to benefit from short-length effect for electromigration reliability.

Figure 31:
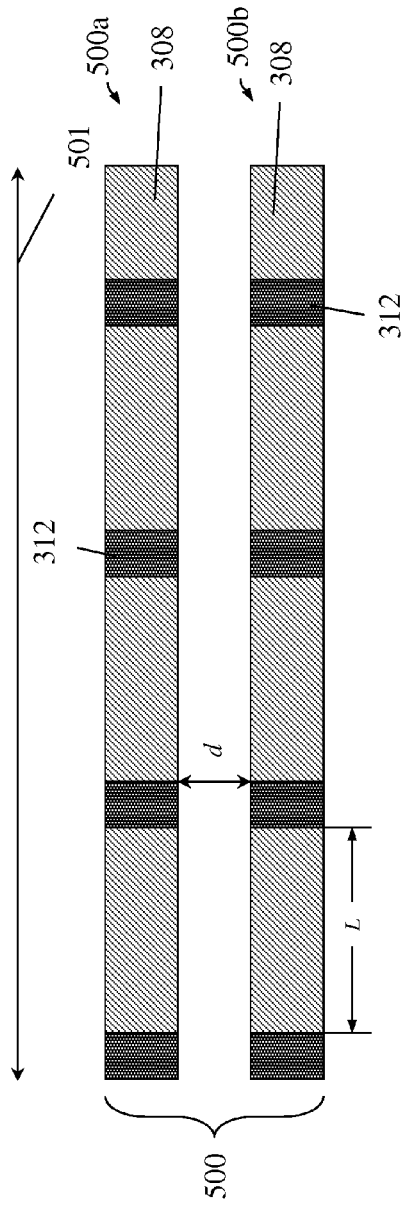
FIG. 31 is a top view of a pair of adjacent interconnect lines as formed, for example, in FIG. 6, in which capping segments are formed at substantially the same locations along a common longitudinal axis.

However, one possible scenario not previously addressed relates to the spacing between metal capping segments on neighboring or adjacent interconnects, which directly relates to the electric field seen between two metal capping segments on neighboring interconnects with different bias conditions. As an example, FIG. 31 illustrates a situation where metal cap regions 312 are separated by a minimum spacing (d) allowed between a pair of neighboring interconnect lines 500, labeled individually as line 500a, line 500b. Stated another way, the metal cap regions 312 of both interconnect line 500a and line 500b are formed at substantially the same locations along a common longitudinal direction represented by axis 501. It can be contemplated that such a configuration is not desirable with respect to TDDB reliability.

Figure 32:
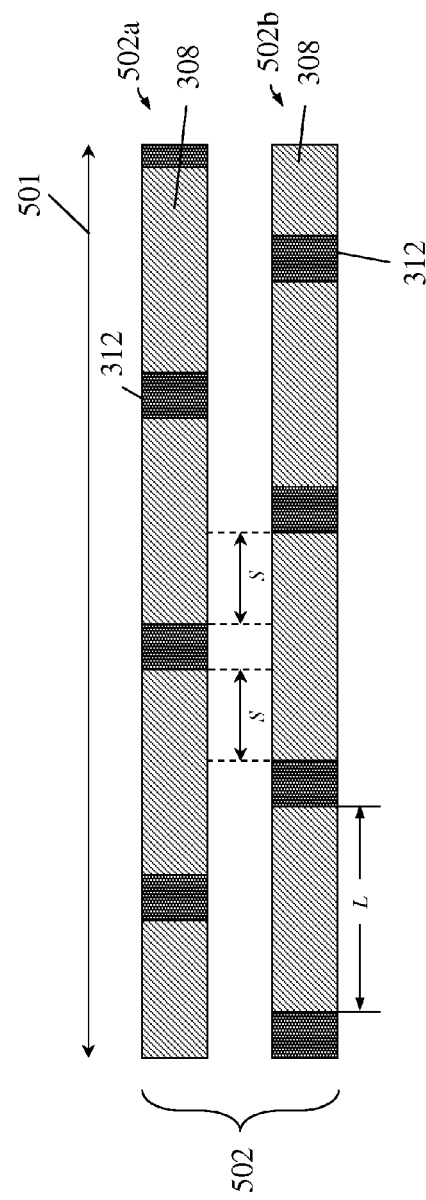
FIG. 32 is a top view of another pair of adjacent interconnect lines as formed, for example, in FIG. 6, in which capping segments are formed at staggered locations along a common longitudinal axis.

Accordingly, FIG. 32 illustrates a pair of neighboring interconnect lines 502, labeled individually as line 502a, line 502b, formed in accordance with a further embodiment. Here, it will be seen that the metal cap regions 312 of interconnect line 502a are formed at staggered locations with respect to the metal cap regions 312 of interconnect line 502b, along the common longitudinal axis 501. This configuration addresses both EM and TDDB reliability, with respect to two critical dimensions depicted in FIG. 32: L and S. Again, L represents the spacing between adjacent metal cap regions 312 on the same interconnect, which value is kept below the Blech length for electromigration reliability. In the present embodiment, an additional dimension (S) for TDDB reliability is introduced, which represents the lateral spacing between two closest metal cap regions 312 on neighboring interconnect lines. The metal cap regions 312 on the neighboring interconnect lines 502a, 502b are arranged so that S is maximized in order to reduce the electric field between closest pairs of metal cap regions 312 of adjacent interconnect lines, thereby extending TDDB lifetime. In one exemplary embodiment, S is selected to be maximized such that the metal cap regions 312 of interconnect line 502a are shifted by about ½ period relative to the metal cap regions 312 of interconnect line 502b. That is, with respect to the common longitudinal direction, the metal cap regions 312 of interconnect line 502a are positioned about halfway between adjacent metal cap regions 312 of interconnect line 502b.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method of forming a wiring structure for an integrated circuit device, the method comprising:
   forming a first metal line within an interlevel dielectric (ILD) layer, and forming a second metal line in the ILD layer adjacent the first metal line;
   masking selected regions of the first and second metal lines such that first portions of the first and second metal lines are covered and second portions of the first and second metal lines are not covered so as to define exposed regions, the masking selected regions comprising depositing a nitrogen-doped silicon carbide layer over the ILD layer and first and second metal lines, and patterning and removing portions of the nitrogen-doped silicon carbide layer;
   selectively plating metal cap regions over exposed regions of the first and second metal lines at periodic intervals such that a spacing between adjacent metal cap regions of an individual metal line corresponds to a critical length, L, at which a back stress gradient balances an electromigration force in the individual metal line, so as to suppress mass transport of electrons;
   wherein the metal cap regions of the first metal line are formed at staggered locations with respect to the metal cap regions of the second metal line, along a common longitudinal axis; and
   following the plating of the metal cap regions over the exposed regions of the first and second metal lines, forming a conformal insulator layer over the metal cap regions and remaining portions of the nitrogen-doped silicon carbide layer.

2. The method of claim 1, wherein a dimension, S, represents a lateral spacing between closest metal cap regions from the first and second metal lines, and wherein the metal cap regions of the first and second metal lines are arranged so that S is maximized in order to reduce the electric field between closest pairs of metal cap regions of the first and second metal lines.

3. The method of claim 2, wherein S is selected to be maximized such that the metal cap regions of the first metal line are shifted by about one-half period relative to the metal cap regions of the second metal line.

4. The method of claim 3, wherein the metal cap regions comprise one or more of: tantalum, (Ta), tantalum nitride (TaN), cobalt (Co), cobalt tungsten phosphide (CoWP), and ruthenium (Ru).

5. The method of claim 1, wherein the conformal insulator layer comprises a conformal nitride layer.

6. A method of forming a wiring structure for an integrated circuit device, the method comprising:
   forming a first metal line within an interlevel dielectric (ILD) layer, and forming a second metal line in the ILD layer over the first metal line;
   masking selected regions of the first and second metal lines such that first portions of the first and second metal lines are covered and second portions of the first and second metal lines are not covered so as to define exposed regions, the masking selected regions comprising depositing a nitrogen-doped silicon carbide layer over the ILD layer and first and second metal lines, and patterning and removing portions of the nitrogen-doped silicon carbide layer;
   selectively plating metal cap regions over exposed regions of the first and second metal lines at periodic intervals such that a spacing between adjacent metal cap regions of an individual metal line corresponds to a critical length, L, at which a back stress gradient balances an electromigration force in the individual metal line, so as to suppress mass transport of electrons;
   wherein the metal cap regions of the first metal line are formed at staggered locations with respect to the metal cap regions of the second metal line, along a common longitudinal axis; and
   following the plating of the metal cap regions over the exposed regions of the first and second metal lines, forming a conformal insulator layer over the metal cap regions and remaining portions of the nitrogen-doped silicon carbide layer.

* * * * *